US008111577B2

(12) United States Patent
Sheets et al.

(10) Patent No.: US 8,111,577 B2
(45) Date of Patent: Feb. 7, 2012

(54) SYSTEM COMPRISING A STATE-MONITORING MEMORY ELEMENT

(75) Inventors: Michael Sheets, Seattle, WA (US); Timothy Williams, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 131 days.

(21) Appl. No.: 11/857,947

(22) Filed: Sep. 19, 2007

(65) Prior Publication Data
US 2008/0259702 A1    Oct. 23, 2008

Related U.S. Application Data

(60) Provisional application No. 60/912,399, filed on Apr. 17, 2007.

(51) Int. Cl.
*G11C 5/14*    (2006.01)
(52) U.S. Cl. .......................... 365/228; 365/226; 365/154
(58) Field of Classification Search .................. 365/200, 365/201, 185.02, 185.2, 185.09, 154, 156
See application file for complete search history.

(56) References Cited

U.S. PATENT DOCUMENTS

| | | | |
|---|---|---|---|
| 4,843,592 A | | 6/1989 | Tsuaki et al. |
| 4,879,505 A | | 11/1989 | Barrow et al. |
| 4,951,171 A | | 8/1990 | Tran et al. |
| 5,386,575 A | | 1/1995 | Shinkai et al. |
| 5,500,823 A | * | 3/1996 | Martin et al. ................. 365/201 |
| 5,530,673 A | * | 6/1996 | Tobita et al. ............. 365/185.09 |
| 5,708,589 A | * | 1/1998 | Beauvais ...................... 700/293 |
| 5,717,256 A | | 2/1998 | Okumura et al. |
| 5,956,279 A | * | 9/1999 | Mo et al. ........................ 365/201 |
| 6,091,227 A | | 7/2000 | Beard |
| 6,101,617 A | | 8/2000 | Burckhartt et al. |
| 6,215,352 B1 | * | 4/2001 | Sudo .............................. 327/530 |
| 6,256,754 B1 | | 7/2001 | Roohparvar |
| 6,348,798 B1 | | 2/2002 | Daw |

(Continued)

FOREIGN PATENT DOCUMENTS

EP        802631 A2 *  10/1997

OTHER PUBLICATIONS

Tektronix, Tektronix Logic Analyzers TLA7000 Series Data Sheet, Jun. 23, 2009.*

(Continued)

*Primary Examiner* — Tuan T Nguyen
*Assistant Examiner* — R Lance Reidlinger

(57) ABSTRACT

Embodiments of the invention relate to a state-monitoring memory element. The state-monitoring memory element may have a reduced ability to retain a logic state than other regular memory elements on an IC. Thus, if the state-monitoring memory elements fails or loses state during testing, it may be a good indicator that the IC's state retention may be in jeopardy, possibly requiring the IC to be reset. The state-monitoring memory element may be implemented by degrading an input voltage supply to the state-monitoring memory element across a diode and/or a transistor. One or more current sources may be used to stress the state-monitoring memory element. A logic analyzer may be used to analyze the integrity of the state-monitoring memory element and trigger appropriate actions in the IC, e.g., reset, halt, remove power, interrupt, responsive to detecting a failure in the state-monitoring memory element. Multiple state-monitoring memory elements may be distributed in different locations on the IC for better coverage.

16 Claims, 4 Drawing Sheets

U.S. PATENT DOCUMENTS

| | | | | |
|---|---|---|---|---|
| 6,754,101 B2* | 6/2004 | Terzioglu et al. | | 365/185.02 |
| 6,853,598 B2* | 2/2005 | Chevallier | | 365/201 |
| 6,885,952 B1 | 4/2005 | Hayes | | |
| 6,891,355 B2 | 5/2005 | Kernahan | | |
| 6,901,014 B2* | 5/2005 | Son et al. | | 365/200 |
| 7,123,033 B1 | 10/2006 | Wright | | |
| 7,193,901 B2* | 3/2007 | Ruby et al. | | 365/185.33 |
| 7,243,118 B2 | 7/2007 | Lou | | |
| 7,283,410 B2* | 10/2007 | Hsu et al. | | 365/201 |
| 7,616,509 B2* | 11/2009 | Qureshi et al. | | 365/201 |
| 2007/0091698 A1* | 4/2007 | Watanabe et al. | | 365/201 |
| 2008/0049507 A1* | 2/2008 | Lee | | 365/185.17 |

OTHER PUBLICATIONS

Calhoun et al. "Standby Power Reduction Using Dynamic Voltage Scaling and Canary Flip-Flop Structures," IEEE Journal of Solid-State Circuits, vol. 39, No. 9, Sep. 2004 pp. 1504-1511.*

Enomoto et al. "A Self-Controllable Voltage Level (SVL) Circuit and its Low-Power High-Speed CMOS Circuit Applications," IEE Journal of Solid-State Circuits, vol. 38, No. 7, Jul. 2003, pp. 1220-1226.*

U.S. Patent and Trademark Office; PCT International Search Report; Sep. 5, 2008; 2 pages.

USPTO Notice of Allowance for U.S. Appl. No. 11/865,672 Apr. 20, 2011; 2 pages.

USPTO Notice of Allowance for U.S. Appl. No. 11/865,672 Mar. 2, 2011; 8 pages.

USPTO Final Rejection for U.S. Appl. No. 11/865,672 Dec. 30, 2009; 6 pages.

USPTO Non-Final Rejection for U.S. Appl. No. 11/865,672 Jul. 17, 2009; 6 pages.

U.S. Appl. No. 12/238,893: "Method and System of Digital Signal Processing," Monte Mar, Filed on Sep. 26, 2008; 26 pages.

U.S. Appl. No. 12/239,450: "Digital Signal Processor Control Architecture," Monte Mar, Filed on Sep. 26, 2008; 28 pages.

USPTO Non-Final Rejection for U.S. Appl. No. 11/859,547 dated Oct. 1, 2009; 9 pages.

USPTO Non-Final Rejection for U.S. Appl. No. 11/967,243 dated Sep. 17, 2009; 9 pages.

USPTO Non-Final Rejection for U.S. Appl. No. 11/967,240 dated Jun. 10, 2009; 7 pages.

USPTO Notice of Allowance for U.S. Appl. No. 11/965,291 dated Apr. 15, 2010; 4 pages.

USPTO Notice of Allowance for U.S. Appl. No. 11/965,291 dated Jan. 13, 2010; 4 pages.

USPTO Notice of Allowance for U.S. Appl. No. 11/965,291 dated Oct. 5, 2009; 2 pages.

USPTO Notice of Allowance for U.S. Appl. No. 11/965,291 dated Sep. 21, 2009; 7 pages.

USPTO Notice of Allowance for U.S. Appl. No. 11/965,291 dated May 5, 2009; 7 pages.

USPTO Non-Final Rejection for U.S. Appl. No. 11/965,291 dated Dec. 17, 2008; 8 pages.

U.S. Appl. No. 13/099,334: "Univerasal digital Block Interconnection and Channel Routing", Warren Snyder et al., Filed on May 2, 2011; 31 pages.

USPTO Non-Final Rejection for U.S. Appl. No. 12/786,412 dated Jan. 31, 2011; 8 pages.

USPTO Notice of Allowance for U.S. Appl. No. 11/965,677 dated May 12, 2011; 5 pages.

USPTO Notice of Allowance for U.S. Appl. No. 11/965,677 dated Jan. 6, 2011; 4 pages.

USPTO Notice of Allowance for U.S. Appl. No. 11/965,677 dated Sep. 15, 2010; 4 pages.

USPTO Notice of Allowance for U.S. Appl. No. 11/965,677 dated May 19, 2010; 4 pages.

USPTO Notice of Allowance for U.S. Appl. No. 11/965,677 dated Feb. 12, 2010; 4 pages.

USPTO Notice of Allowance for U.S. Appl. No. 11/965,677 dated Nov. 2, 2009; 4 pages.

USPTO Notice of Allowance for U.S. Appl. No. 11/965,677 dated Sep. 10, 2009; 6 pages.

USPTO Non-Final Rejection for U.S. Appl. No. 11/965,677 dated Mar. 10, 2009; 10 pages.

USPTO Non-Final Rejection for U.S. Appl. No. 11/968,145 dated Jan. 5, 2011; 8 pages.

USPTO Final Rejection for U.S. Appl. No. 11/968,145 dated Aug. 2, 2010; 6 pages.

USPTO Non-Final Rejection for U.S. Appl. No. 11/968,145 dated Mar. 4, 2010; 11 pages.

U.S. Appl. No. 12/104,391: "Clock Driven Dynamic Datapath Chaining," Warren Synder et al., Filed on Apr. 16, 2008; 31 pages.

USPTO Non-Final Rejection for U.S. Appl. No. 12/060,176 dated Apr. 6, 2011; 23 pages.

USPTO Final Rejection for U.S. Appl. No. 12/060,176 dated Oct. 12, 2010; 22 pages.

USPTO Non-Final Rejection for U.S. Appl. No. 12/060,176 dated Mar. 30, 2010; 22 pages.

USPTO Notice of Allowance for U.S. Appl. No. 12/104,672 dated Jun. 2, 2011; 9 pages.

USPTO Notice of Allowance for U.S. Appl. No. 12/104,672 dated Feb. 14, 2011; 9 pages.

USPTO Notice of Allowance for U.S. Appl. No. 12/104,672 dated Oct. 28, 2010; 8 pages.

USPTO Notice of Allowance for U.S. Appl. No. 12/104,672 dated Jul. 22, 2010; 8 pages.

USPTO Notice of Allowance for U.S. Appl. No. 12/104,672 dated Apr. 19, 2010; 8 pages.

USPTO Notice of Allowance for U.S. Appl. No. 12/104,672 dated Jan. 11, 2010; 7 pages.

USPTO Non-Final Rejection for U.S. Appl. No. 12/104,672 dated Aug. 26, 2009; 11 pages.

USPTO Advisory Action for U.S. Appl. No. 12/104,678 dated Feb. 16, 2011; 5 pages.

USPTO Final Rejection for U.S. Appl. No. 12/104,678 dated Dec. 3, 2010; 9 pages.

USPTO Non-Final Rejection for U.S. Appl. No. 12/104,678 dated Jul. 2, 2010; 8 pages.

USPTO Final Rejection for U.S. Appl. No. 11/963,661 dated May 6, 2011; 7 pages.

USPTO Non-Final Rejection for U.S. Appl. No. 11/963,661 dated Dec. 3, 2010; 18 pages.

USPTO Advisory Action for U.S. Appl. No. 11/963,661 dated Aug. 27, 2010; 3 pages.

USPTO Final Rejection for U.S. Appl. No. 11/963,661 dated Jun. 22, 2010; 11 pages.

USPTO Non-Final Rejection for U.S. Appl. No. 11/963,661 dated Feb. 4, 2010; 11 pages.

USPTO Notice of Allowance for U.S. Appl. No. 12/060,128 dated Oct. 19, 2009; 8 pages.

USPTO Non-final Rejection for U.S. Appl. No. 12/060,128 dated Apr. 29, 2009; 11 pages.

USPTO Notice of Allowance for U.S. Appl. No. 10/954,709 dated Jun. 20, 2006; 7 pages.

USPTO Final Rejection for U.S. Appl. No. 10/945,709 dated Feb. 9, 2006; 14 pages.

USPTO Non-Final Rejection for U.S. Appl. No. 10/945,709 dated Sep. 7, 2005; 14 pages.

* cited by examiner

SYSTEM COMPRISING A STATE-MONITORING MEMORY ELEMENT

RELATED APPLICATIONS

This application claims the benefit of U.S. Provisional Application No. 60/912,399, filed Apr. 17, 2007, which is incorporated herein by reference.

TECHNICAL FIELD

The present disclosure relates generally to Integrated Circuits (ICs), and more particularly to a state-monitoring memory element to detect potential failures in ICs.

BACKGROUND

In many IC applications, some means for monitoring a voltage state of certain elements on the IC are needed. For example, when an input voltage supply to one or more elements on the IC falls below a certain voltage threshold, a "reset" signal might be generated to reset the IC in order to avoid damage to the IC.

A voltage detector circuit implementing a low voltage detection function may be used to monitor the voltage state of the elements on the IC. The voltage detector circuit may include a voltage divider coupled to a field effect transistor (FET). A scaled input voltage taken across the voltage divider may be supplied to the gate input of the FET. If an input voltage supply is high, the FET will be turned on, in which case the voltage detector circuit does not issue a reset signal. On the other hand, if the input voltage supply drops below a certain voltage threshold, the FET will be turned off, and the voltage detector circuit generates a reset signal to reset the IC. The above-described voltage detector circuit incurs high power consumption since the resistive voltage divider constantly drains current from the input voltage supply. In addition, since the voltage detector circuit requires a certain voltage threshold to turn on the FET, the voltage threshold required to trigger the reset signal may not be low enough. As a result, unnecessary reset signal may occur at the output of the voltage detector circuit.

DESCRIPTION OF EXAMPLE EMBODIMENTS

Overview

A system comprises at least one state-monitoring memory element having a reduced ability to retain a logic state compared to a normal memory element; and a failure detection element, such as a logic analyzer, to detect a failure in the state-monitoring memory element and to generate an indicator of failure responsive to the detection. The system may comprise a voltage supply circuit to degrade an input voltage and to provide the degraded input voltage to the state-monitoring memory element, wherein the voltage supply circuit comprises one of a diode or a transistor. Alternatively, the system may comprise at least one current source to stress the state-monitoring memory element.

A method includes configuring the state-monitoring memory element to have a reduced ability to retain a logic state compared to a normal memory element; detecting a failure in the state-monitoring memory element; and generating an indicator of failure responsive to detecting the failure in the state-monitoring memory element. The method includes degrading an input voltage across one of a diode or a transistor. At least one current source may be coupled to the state-monitoring memory element to stress the state-monitoring memory element. The method further includes presetting the state-monitoring memory element to a logic state and detecting if the state-monitoring memory element loses the preset logic state after a power transient.

BRIEF DESCRIPTION OF THE DRAWINGS

The foregoing and other objects, advantages and features will become more readily apparent by reference to the following detailed description in conjunction with the accompanying drawings.

DETAILED DESCRIPTION

Figure 1:
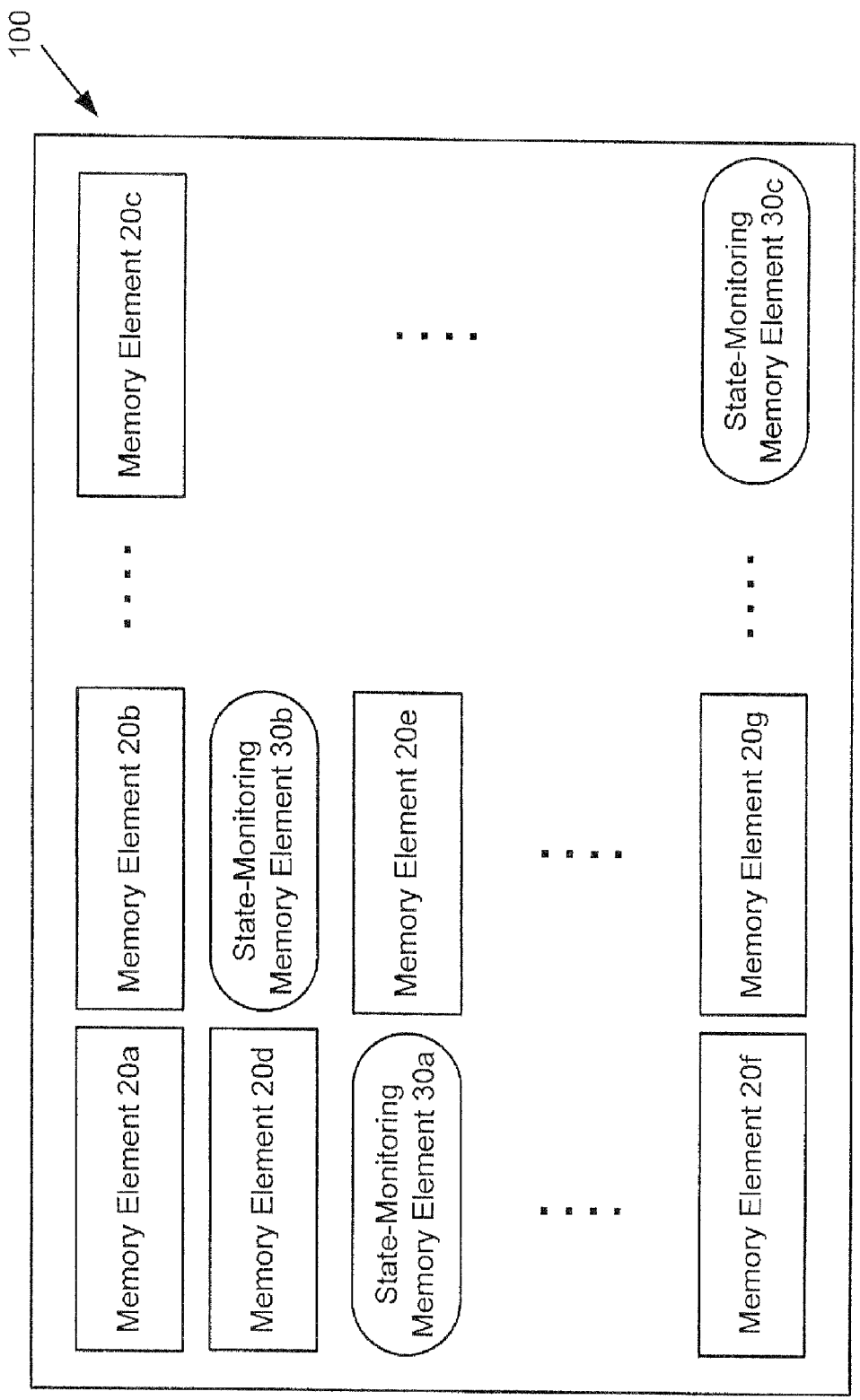
FIG. 1 is a schematic block diagram illustrating an example IC 100 having state monitoring memory elements according to embodiments of the invention.

FIG. 1 is a schematic block diagram illustrating an example integrated circuit (IC) 100 having state-monitoring memory elements according to embodiments of the invention. It should be recognized that FIG. 1 may include other elements, which are not illustrated in order to simplify the figures and which may not be necessary to understand the example system disclosed below.

Figure 3:
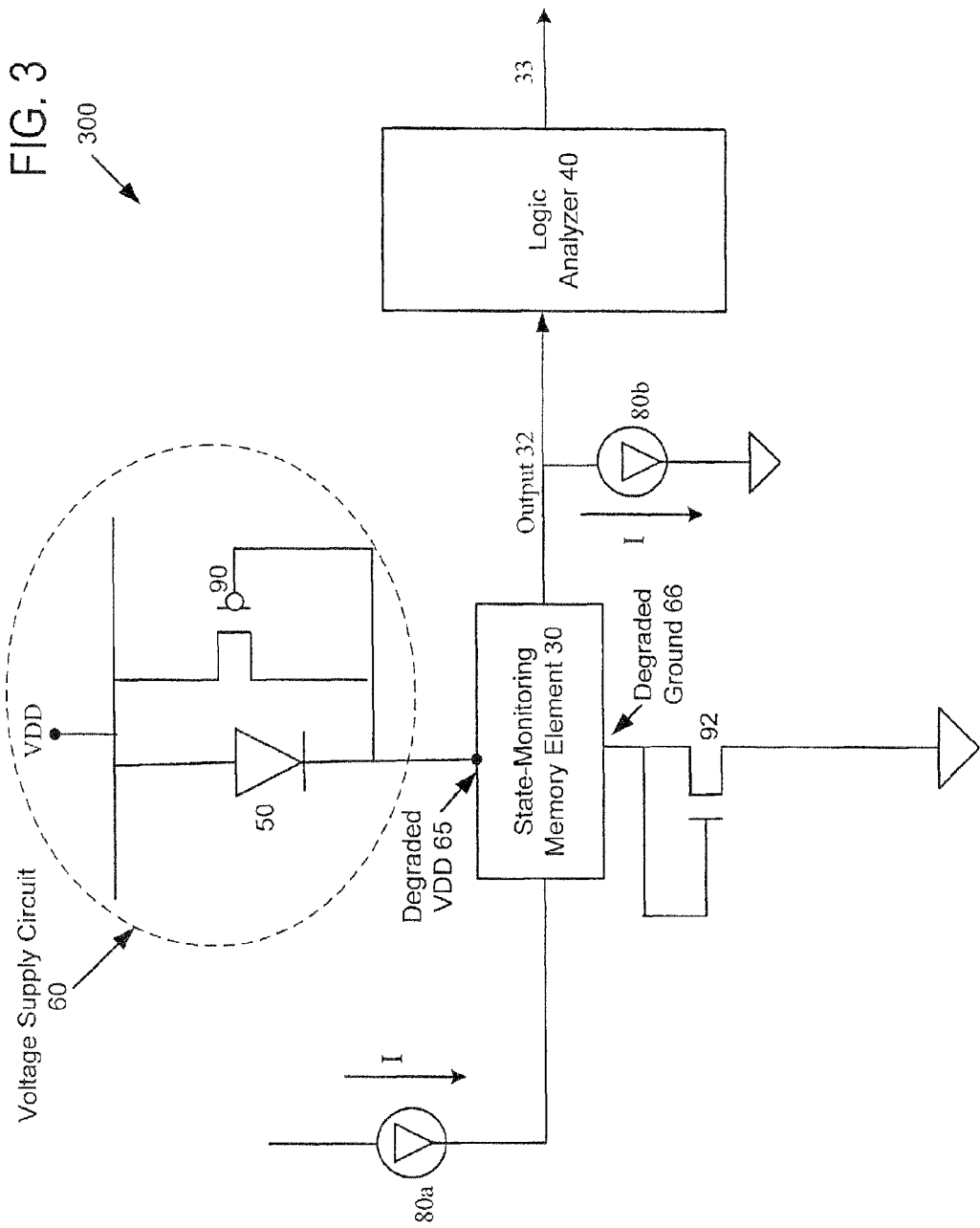
FIG. 3 is a schematic block diagram illustrating an example circuit 300 for configuring the state-monitoring memory element 30 of FIG. 1.

Referring to FIG. 1, the IC 100 may include one or more regular memory elements, such as 20a-20g. Each regular memory element 20a-20g may be a register, a memory cell, a latch, an array of registers or memory cells, and/or the like. The IC 100 may additionally include one or more state-monitoring memory elements, such as 30a-30c. Each state-monitoring memory element 30a-30c may be configured to have a reduced ability to retain a logic state than the regular memory elements 20a-20g in the IC 100. For example, a regular memory element, such as 20a-20g, may fail to operate or lose its logic state when an input voltage supply to the regular memory element drops to approximately 1.0 volt, whereas a state-monitoring memory element, such as 30a-30c, may fail at an input voltage supply of approximately 1.2 volts. In others words, a state-monitoring memory element 30a-30c may be more sensitive to a voltage drop than a regular memory element 20a-20g such that the state-monitoring memory element 30a-30c fails earlier than a regular memory element 20a-20g as the input voltage supply degrades over time. In some embodiments, if any one of the state-monitoring memory elements 30a-30c fails or loses state, it may be a good indicator that the IC 100's state retention may be in jeopardy, possibly requiring the IC 100 to be reset. FIG. 3 describes how the state-monitoring memory element 30 may be configured to have a reduced ability to retain a memory state than other regular memory element 20 in the IC 200, such that the state-monitoring memory element 30 fails before the regular memory element 20 in the IC 100.

Although FIG. 1 shows only three state-monitoring memory elements 30a-30c, the IC 100 may include any number of state-monitoring memory elements. Each of the state-monitoring memory elements 30a-30c may be implemented as a register, a memory cell, a latch, an array of registers or memory cells, and/or the like. In some embodiments, the state-monitoring memory elements 30a-30c may be distributed in different locations of the IC 100 for better coverage.

Figures 2A, 2B, 2C:
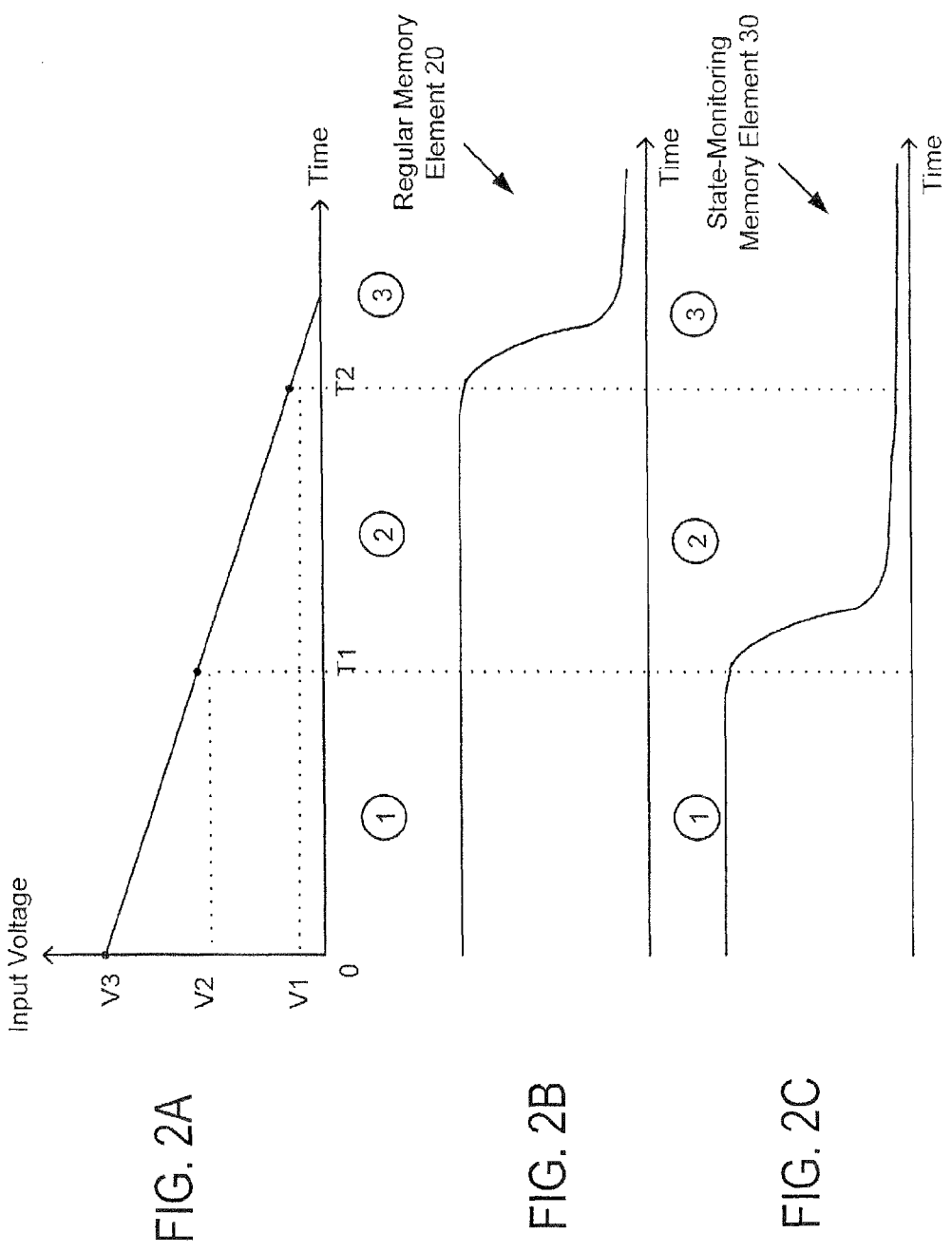
FIGS. 2A, 2B, and 2C illustrate further details of the state-monitoring memory element 30 of FIG. 1.

FIGS. 2A, 2B, and 2C illustrate the effects of a voltage drop on a state-monitoring memory element 30 and a regular memory element 20 of FIG. 1. FIG. 2A shows a voltage curve, in which the input voltage declines linearly as a function of time. In FIG. 2A, the input voltage value V1 is less than the input voltage value V2, which is in turn less than the input voltage value V3. The voltages curve of FIG. 2A represents an input voltage supply to the regular memory element 20 and the state-monitoring memory element 30. The voltage curve of FIG. 2 may also decline as another function of time.

FIGS. 2B and 2C respectively shows the effect of a voltage drop on the regular memory element 20 and the state-monitoring element 30. In FIG. 2B, the regular memory element 20 may continue to operate or keep its memory state, e.g., regions 1 and 2, as long as the input voltage is above the input voltage value V1. When the input voltage falls below the input voltage value V1 at time T2, the regular memory element 20 may fail or lose its memory state, e.g., region 3. On the other hand, as shown in FIG. 2C, the state-monitoring memory element 30 may fail to operate or lose its memory state when the input voltage falls below the input voltage value V2 at time T1. In others words, the state-monitoring memory element 30 may be more sensitive to a voltage drop than the regular memory element 20 such that the state-monitoring memory element 30 fails earlier than a regular memory element 20 as the input voltage degrades over time. Thus when the state-monitoring memory element 30 fails, it may be a good indicator that the IC 100's state retention may be in jeopardy, possibly resulting in a reset of the IC 100.

FIG. 3 is a schematic block diagram illustrating an example circuit 300 for configuring the state-monitoring memory element 30 of FIG. 1. Referring to FIG. 3, the circuit 300 may include a voltage supply circuit 60 for supplying voltages to the state-monitoring memory element 30. The voltage supply circuit 60 receives a voltage VDD derived from a voltage source (not shown), such as a battery. The voltage VDD may be degraded to some voltage level, e.g., degraded VDD 65, which may be supplied to the positive power supply of the state-monitoring memory element 30. The state-monitoring memory element 30 may be implemented as a register, a memory cell, a latch, an array of registers or memory cells, and/or the like.

As shown in FIG. 3, the voltage VDD may be degraded by coupling a diode 50 to the positive power supply of the state-monitoring memory element 30. When the voltage VDD exceeds a threshold value of the diode 50, the diode 50 would be turned on to effectuate a voltage drop, resulting in the degraded VDD 65. Alternatively, the voltage VDD may be degraded by coupling a transistor device, e.g., a p-channel metal-oxide-semiconductor field-effect transistor (PMOS) 90, to the state-monitoring memory element 30. The amount of voltage drop may depend on a threshold voltage of the transistor device and a gate bias voltage of the transistor device. For example, when the voltage VDD exceeds a certain value, the PMOS 90 would be turned on to effectuate a voltage drop, resulting in the degraded VDD 65. Although FIG. 3 shows that a PMOS 90 is used to degrade the voltage VDD, an n-channel MOSFET (NMOS) may be used to degrade the voltage VDD.

Similarly, a diode (not shown) and/or a transistor device (e.g., NMOS transistor 92) may be coupled to the negative power supply of the state-monitoring memory element 30 to degrade the voltage supply to the state-monitoring memory element 30 using the same principle described above. For example, as shown in FIG. 3, the NMOS transistor 92 may be coupled to the negative power supply of the state-monitoring memory element 30 such that when the gate bias voltage of the NMOS 92 exceeds its threshold voltage, the NMOS 92 may be turned on to effectuate a voltage drop, e.g., degraded ground 66.

One or more current sources, such as 80a, 80b, may be coupled to the state-monitoring memory element 30 to stress the state-monitoring memory element 30 due to the load current that flows through the state-monitoring memory element 30. These current sources may degrade the voltage at output 32 below the degraded VDD 65, and thus compromising the state-retention ability of the state-monitoring memory element 30. It should be noted that the current in the current sources 80a and 80b may be small, e.g. on the order of 10 nA.

The state-monitoring memory element 30 may be initialized by writing it with a logic state, e.g., "1". After degrading the voltage supply of the state-monitoring memory element 30 to a certain voltage value, the state-monitoring memory element 30 may fail or lose its memory state, in which case the state-monitoring memory element 30 may output a "0 to the logic analyzer 40 (assuming that the state-monitoring memory element has been initialized with a logic state of "1"). It should be noted that the state-monitoring memory element 30 may be initialized to a logic state other than logic state "1", e.g., logic state "0", such that failures many be detected on either logic state "1" or "0". The logic analyzer 40 analyzes the output 32 of the state-monitoring memory element 30 to determine whether the state-monitoring memory element 30 has failed or lost its memory state. If the logic analyzer 40 detects a failure in the state-monitoring memory element 30, the logic analyzer 40 may issue a signal 33 to trigger appropriate actions in the IC 100, such as resetting the IC 100, halting the IC 100, removing power, or generating an interrupt.

The above describes various means that may be used to degrade the state-retention ability of the state-monitoring element 30, such as by coupling a diode, a transistor device, current sources, or a combination thereof, to the state-monitoring memory element 30. The voltage threshold required to trigger a reset signal may be controlled to reduce the occurrence of unnecessary resets in the IC 100. In addition, the circuit 300 consumes less power than the resistive voltage divider mentioned earlier.

Figure 4:
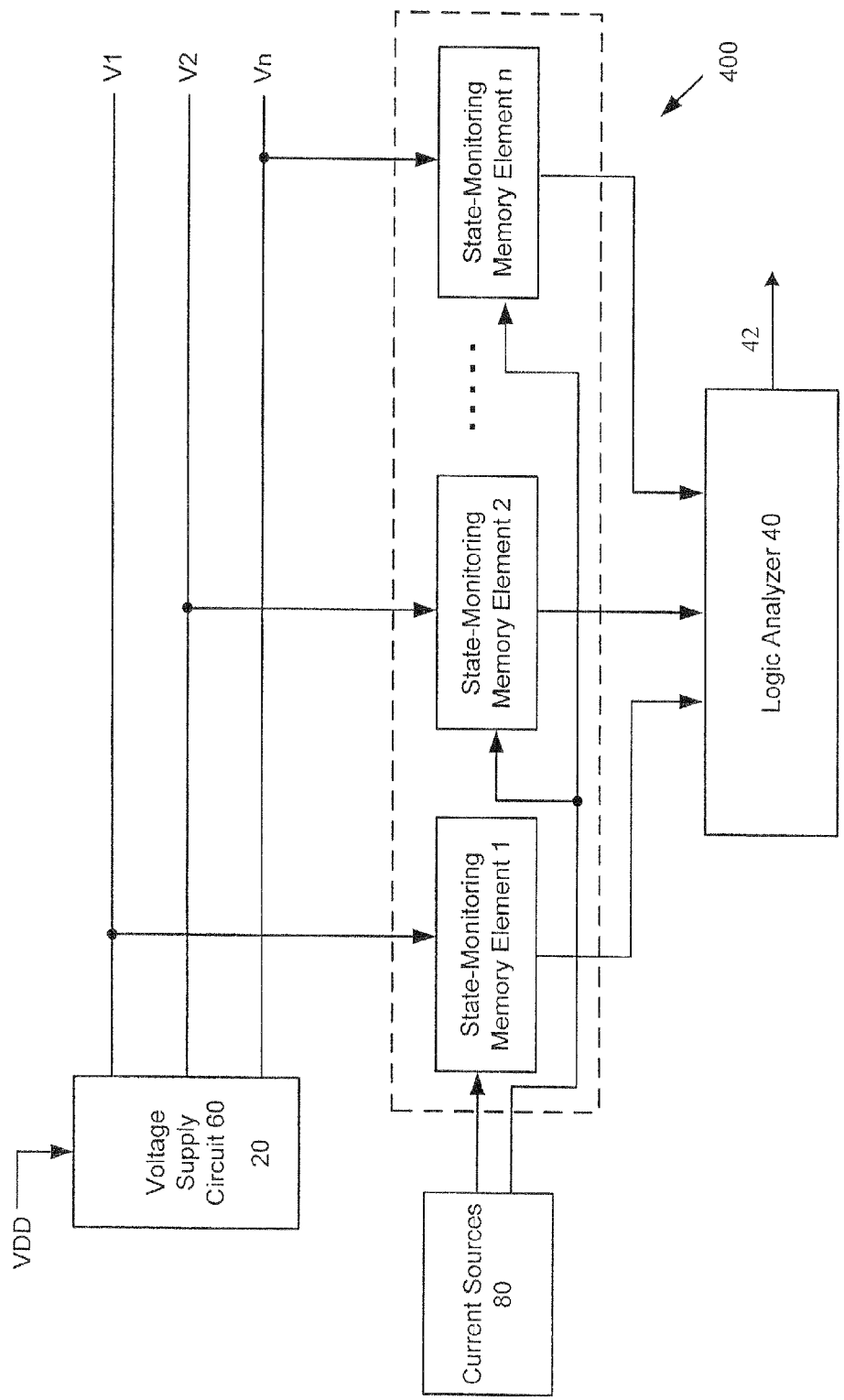
FIG. 4 is a schematic block diagram illustrating an array of the state-monitoring memory element 30 of FIG. 1.

FIG. 4 is a schematic block diagram illustrating an array of the state-monitoring memory element 30 of FIG. 1. Referring to FIG. 4, the IC 100 may include an array 400 of state-monitoring memory elements, such as state-monitoring memory element 1, state-monitoring memory element 2, ..., and state-monitoring memory element n, where n>=3. The IC 100 may also include a voltage supply circuit 60 to generate various input voltages, such as V1, V2, ..., and Vn, where n>=3, each representing a same or different voltage level. Each of these input voltages V1, V2, ..., Vn may be supplied to a respective state-monitoring memory element. Additionally, each of the respective state-monitoring memory elements may be coupled to one or more current sources 80. The current sources 80 may stress the state-monitoring memory element as a result of the load current that flows through the state-monitoring memory element. Consequently, the current sources 80 may cause the respective state-monitoring memory element to be more vulnerable to voltage degradation and thus more likely to fail when the input voltages V1, V2, ..., Vn degrade to a certain voltage value. State-monitoring memory element 1, state-monitoring memory element 2, ..., and state-monitoring memory element n may each be implemented as a register, a memory cell, a latch, an array of registers or memory cells, and/or the like.

A logic analyzer 40 is used in the IC 100 to analyze the integrity of the respective state-monitoring memory elements. In some embodiments, state-monitoring memory element 1, state-monitoring memory element 2, . . . , and state-monitoring memory element n, may each be initialized by writing to it a logic state, e.g., 1. After degrading the input voltages V1, V2, . . . , Vn for the respective state-monitoring memory element to a certain voltage value, one or more of these state-monitoring memory elements may fail or lose its memory state. For example, if the initial logic state in the respective state-monitoring memory elements is "1", the state-monitoring element may lose the original logic state due to a voltage drop in the respective input voltages, in which case the logic state in the state-monitoring memory element may be "0". It should be noted that these state-monitoring memory elements may each be initialized to a logic state other than logic state "1", e.g., logic state "0", such that failures may be detected on either logic state "1" or "0". The logic analyzer 40 analyzes the output of the respective state-monitoring memory elements to determine whether one or more of the state-monitoring memory elements have lost the memory state. If the logic analyzer 40 detects that any one of these state-monitoring memory elements fails or loses its memory state, the logic analyzer 40 may issue a signal 42 to trigger appropriate actions in the IC 100, such as resetting the IC, halting the IC, removing power, or generating an interrupt. For example, a reset signal may be sent to a central processor unit (not shown) to possibly reset the IC 100. The array of state-monitoring memory elements may be distributed in different locations in the IC 100 for better coverage.

Embodiments of the invention relate to a state-monitoring memory element for detecting potential IC failures. Embodiments of the invention allow for an accurate detection of potential IC failures, while consuming less power. The state-monitoring memory element may have a reduced ability to retain a logic state than other regular memory elements on an IC. Thus, if the state-monitoring memory elements fails or loses state during testing, it may be a good indicator that the IC's state retention may be in jeopardy, possibly requiring the IC to be reset. The state-monitoring memory element may be implemented as a register, a memory cell, a latch, or an array of registers or memory cells. The state-monitoring memory element may be degraded by dropping an input voltage supply across a diode, a transistor, or a combination of both. At least one current source may be used to stress the state-monitoring memory element. A logic detector may be used to analyze the integrity of the state-monitoring memory element. The logic analyzer may trigger appropriate actions in the IC responsive to detecting a failure of the state-monitoring memory element. Multiple state-monitoring memory elements may be distributed in different locations on the IC for better coverage.

Further modifications and alternative embodiments of this invention will be apparent to those skilled in the art in view of this description. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. A system, comprising:
at least one state-monitoring memory element having a reduced ability to retain a logic state compared to a normal memory element, the at least one state-monitoring memory element configured to lose the logic state before the normal memory element when a degraded input supply voltage drops below a threshold voltage;
a circuit element, distinct from the at least one state-monitoring memory element, configured to cause the at least one state-monitoring memory element but not the normal memory element to have the reduced ability; and
a failure detection element configured to detect a failure by the at least one state-monitoring memory element to retain the logic state and responsive to the detection to generate an indicator of the failure, and wherein the failure detection element is further configured to issue an interrupt signal to a system processor.

2. The system of claim 1, wherein the at least one state-monitoring memory element is one of a register, a memory cell, a latch, an array of registers, or an array of memory cells.

3. The system of claim 1, wherein the circuit element includes:
a voltage supply circuit configured to degrade an input voltage and to provide the degraded input voltage to the at least one state-monitoring memory element,
wherein the voltage supply circuit comprises one of a diode, a transistor, or a combination thereof.

4. The system of claim 1, wherein the circuit element includes at least one current source coupled to the at least one state-monitoring memory element.

5. The system of claim 1, wherein the failure detection element is adapted to issue a reset signal responsive to detecting the failure in the at least one state-monitoring memory element.

6. A method, comprising:
configuring a state-monitoring memory element to have a reduced ability to retain a logic state compared to a normal memory element, by using a circuit element that is distinct from the state-monitoring memory element to cause the reduced ability detecting a failure by the state-monitoring memory element to retain an initial logic state responsive to an input supply voltage coupled to the state-monitoring memory element dropping below a threshold voltage;
generating an indicator of failure responsive to detecting the failure by the state-monitoring memory element earlier than a failure of the normal memory element; and
generating an interrupt signal in response to detecting the failure in the state-monitoring memory element.

7. The method of claim 6, wherein the configuring the state-monitoring memory element comprises degrading an input voltage across one of a diode, a transistor, or a combination thereof, and providing, the degraded input voltage to the state-monitoring memory element.

8. The method of claim 6, wherein the configuring the state-monitoring memory element comprises stressing the state-monitoring memory element by coupling the state-monitoring memory element to at least one current source.

9. The method of claim 6, further comprising presetting the state-monitoring memory element to a logic state responsive to detecting the failure in the state-monitoring memory element.

10. The method of claim 9, wherein the detecting the failure in the state-monitoring memory element comprises detecting whether the state-monitoring memory element loses the preset logic state after a power transient.

11. The method of claim 6, further comprising generating a reset signal responsive to detecting the failure in the state-monitoring memory element.

12. A system, comprising:
means for configuring a state-monitoring memory element to have a reduced ability to retain a logic state compared to a normal memory element, such that the state-monitoring memory element is more likely to experience logic state loss before the normal memory element when an input supply voltage associated with the state-monitoring memory element drops below a threshold voltage; and a failure detection element configured to detect a failure by the state-monitoring memory element to retain the logic state by comparing an initial logic state of the state-monitoring memory element with a current logic state of the state-monitoring memory element, and further configured to generate an indicator of failure responsive to detecting the failure by the state-monitoring memory element.

13. The system of claim 12, wherein the means for configuring the state-monitoring memory element comprises one of a diode, a transistor, or a combination thereof.

14. The system of claim 12, wherein the means for configuring the state-monitoring memory element comprises at least one current source coupled to the state-monitoring memory element for stressing the state-monitoring memory element.

15. The system of claim 12, wherein the state-monitoring memory element is initialized by writing a logic state to the state-monitoring memory element.

16. The system of claim 12, wherein the failure detection element is further configured to generate a reset signal responsive to detecting the failure in the state-monitoring memory element.

* * * * *